US008165319B2

(12) United States Patent
Fisher

(10) Patent No.: US 8,165,319 B2

(45) Date of Patent: Apr. 24, 2012

(54) METHOD AND SYSTEM FOR REPRODUCING AN AUDIO SIGNAL

(75) Inventor: Michael John Amiel Fisher, Chatswood (AU)

(73) Assignee: HearWorks Pty Ltd, East Melbourne (AU)

( * ) Notice: Subject to any disclaimer, the term of this patent is extended or adjusted under 35 U.S.C. 154(b) by 1133 days.

(21) Appl. No.: 11/915,542

(22) PCT Filed: May 25, 2006

(86) PCT No.: PCT/AU2006/000696

§ 371 (c)(1), (2), (4) Date: Dec. 19, 2007

(87) PCT Pub. No.: WO2006/125265

PCT Pub. Date: Nov. 30, 2006

(65) Prior Publication Data

US 2008/0199019 A1 Aug. 21, 2008

(30) Foreign Application Priority Data

May 25, 2005 (AU) ................................ 2005902653

(51) Int. Cl.
*H03G 3/00* (2006.01)

(52) U.S. Cl. .......................................... 381/104; 381/74

(58) Field of Classification Search .................... 381/56, 381/58, 59, 72, 74, 98–109

See application file for complete search history.

(56) References Cited

U.S. PATENT DOCUMENTS

| | | | | |
|---|---|---|---|---|
| 5,355,418 | A | 10/1994 | Kelsey et al. | |
| 5,448,620 | A * | 9/1995 | Gershkovich et al. | 455/552.1 |
| 2004/0234079 | A1 | 11/2004 | Schneider et al. | |
| 2005/0135631 | A1 | 6/2005 | Yoshino | |

FOREIGN PATENT DOCUMENTS

| | | | |
|---|---|---|---|
| WO | WO-03/003570 | A1 | 1/2003 |
| WO | WO-03/003790 | A1 | 1/2003 |
| WO | WO-03/077236 | A1 * | 9/2003 |

OTHER PUBLICATIONS

International Search Report and Written Opinion from corresponding International application No. PCT/AU2006/000696, dated Aug. 29, 2006.

* cited by examiner

*Primary Examiner* — Ha Tran T Nguyen
*Assistant Examiner* — Kevin Quinto
(74) *Attorney, Agent, or Firm* — Marshall, Gerstein & Borun LLP; Richard M. LaBarge

(57) ABSTRACT

A system and method of reproducing an audio signal produced by an audio system which includes an earphone is described. The method including the steps of: receiving an audio signal; estimating short-term characteristics of the acoustic exposure of a listener; recording the short-term characteristics; controlling the audio signal and; outputting the controlled audio signal for reproduction. The system or method of the invention may be applied to any sound reproduction system that reproduces sounds by way of an earphone such as telephone headsets or handsets, personal music players, mobile telephones, and two way radios.

23 Claims, 9 Drawing Sheets

METHOD AND SYSTEM FOR REPRODUCING AN AUDIO SIGNAL

TECHNICAL FIELD

This invention relates to a method and system for reproducing an audio signal.

The entire contents of published international patent applications PCT/AU02/00852 (WO03/003790) and PCT/AU03/00301 (WO03/077236) attributed to the current inventor are incorporated herein by reference.

BACKGROUND TO THE INVENTION

Earphones are contained within devices such as headsets, headphones, handsets, earbuds and inset earphones and have the potential to produce sound levels that can harm or cause discomfort to the listener of these devices. Harm such as the loss of hearing sensitivity can occur as a result of either excessive short-term exposure or long-term exposure to sound. Other hearing dysfunctions that may result from excessive exposure to sound include tinnitus, reduced speech understanding, hyperacusis and ear pain, the later two in particular have been observed to result from short-term exposure. Short-term exposure which is perceived by the listener to be loud and abrupt may result in symptoms affecting other parts of the body such as pain/ache within the head and/or neck. Injury resulting from short-term exposure to sound, which is perceived as being both loud and abrupt, has been described as an acoustic shock injury.

To reduce the occurrence and severity of injury to the listener methods of limiting the short-term and long-term sound exposure have been developed. These include the suppression of sounds known to cause injury, known as shriek rejection as well as broadband and frequency specific level control with a variety of response times. Methods of monitoring and recording the short-term and long-term exposure of a listener have also been developed. Devices have been developed to control the long-term sound exposure of a listener based on an estimate of the long-term exposure. One device predicts the future long-term sound exposure from past estimates of sound exposure combined with data on the anticipated use which it uses to control the current amplification of the signal.

Many of the injuries to users of earphones have resulted from short-term exposure and therefore long-term level control and recording offers nothing in the prevention of this injury or furthers the understanding of it.

SUMMARY OF THE INVENTION

In a first aspect the present invention provides a method of reproducing an audio signal by way of an audio system which includes an earphone, the method including the steps of: receiving an audio signal; estimating short-term characteristics of the acoustic exposure of a listener; recording the short-term characteristics; controlling the audio signal and; outputting the controlled audio signal for reproduction.

The short-term characteristics may be estimated based on characteristics of the audio system.

The short-term characteristics may be estimated based on characteristics of the controlled audio signal.

The short-term characteristics may be estimated based on characteristics of the received audio signal.

The short-term characteristics may include the short-term level.

The short-term characteristics may include the maximum of the short-term level within a specified time period.

The short-term characteristics may include characteristics which are frequency specific.

The short-term characteristics may include the time at which the maximum occurred.

The short-term characteristics may include the duration over which the short-term level exceeds a predetermined fraction of the maximum short-term level.

The short-term characteristics may include the abruptness of the maximum of the short-term level.

The abruptness may be determined by calculating the difference in the time between the time of the maximum and the preceding time in which the short-term level is below the maximum by a predetermined amount.

The short-term characteristics may include an identification code for the signal that produced the maximum short-term level.

The identification code may be determined to be a code associated with predefined characteristics.

The predefined characteristics may include the spectral content.

The predefined characteristics may include the temporal content.

In a second aspect the present invention provides a system for reproducing an audio signal produced by an audio system which includes an earphone, the system including: receiving means for receiving an audio signal; estimating means for estimating short-term characteristics of the acoustic exposure of a listener; recording means for recording the short-term characteristics; control means for controlling the audio signal and; outputting means for outputting the controlled audio signal for reproduction.

The system may further include identification means for producing an identification code representative of a particular type of received signal.

In a third aspect the present invention provides a computer software program providing instructions for controlling a computing system to carry out a method according to the first aspect of the invention.

In a fourth aspect the present invention provides a computer readable medium providing a computer software program according to the third aspect of the invention.

By recording details of the short-term characteristics it is possible to later analyse the cause or extent of an acoustic exposure incident. Further, this is achieved without the need to record the actual signal itself. By recording only characteristics of the signal the amount of data that needs to be recorded may be reduced.

BRIEF DESCRIPTION OF THE DRAWINGS

Embodiments of the present invention will now be described, by way of example only, with reference to the accompanying drawings, in which.

DETAILED DESCRIPTION OF PREFERRED EMBODIMENTS

Figure 1:
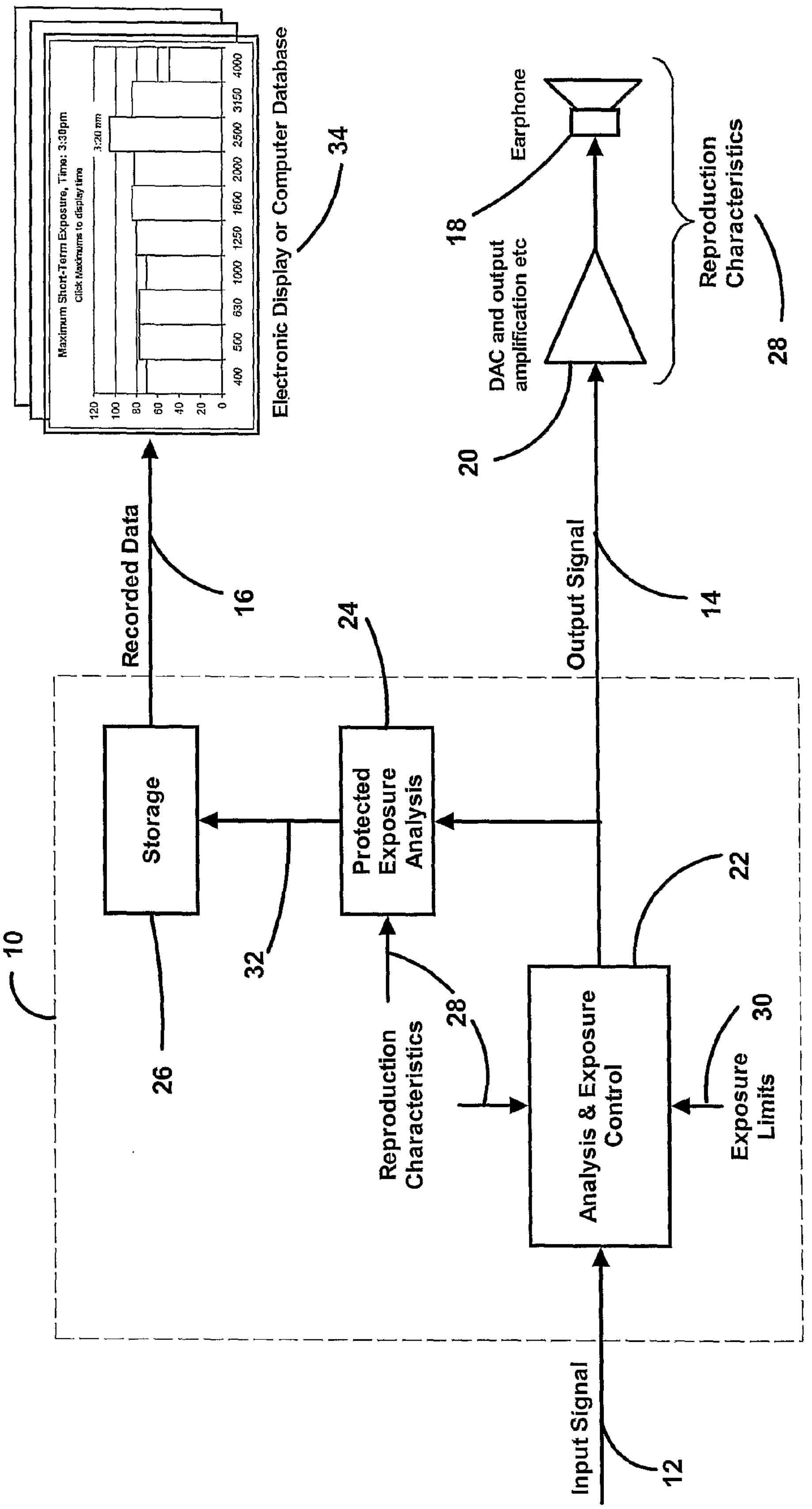
FIG. 1 is a schematic view of a first embodiment of a system according to the present invention.

Referring to FIG. 1, a system for reproducing an audio signal produced by an audio system is shown which includes a system 10 for controlling and recording earphone sound levels. The system 10 includes receiving means in the form of input 12 which is arranged to receive a digital signal, optionally this signal can be from an analog source which has been converted to a digital signal by an analog to digital converter (not shown). The system includes outputting means for outputting a digital output signal at output 14. The system is arranged to produce recorded data at output 16. The output signal 14 is reproduced by earphone 18 which is connected to output signal process 20. The output signal process 20 includes digital to analog conversion, and analog circuitry to drive the earphone.

The system further includes estimating means for estimating characteristics of the acoustic exposure of a listener in the form of protected exposure analysis 24. The system further includes recording means for recording characteristics of the acoustic exposure in the form of storage 26. The system further includes control means for controlling the audio signal in the form of analysis and exposure control 22.

The system 10 or any part of it may be performed in the analog domain with the appropriate conversions between the domains, these conversions are not shown in FIG. 1. In the preferred and other embodiments described system 10 is embodied in software controlling digital signal processing hardware. Various sampling rates may be employed, an 8 kHz sampling rate is used in telecommunication applications where the signal bandwidth does not exceed 4 kHz.

In operation, system 10 receives a signal at input 12. Analysis and exposure control 22 operates to control the level of the input signal 12 to produce a controlled output signal 14. This includes assessing the level of the input signal 12. This process further includes frequency weighting the input signal to produce an estimate of the level at the ear reference point ERP, the eardrum point, DRP or another point. The frequency weightings for a specific audio reproduction system including the earphone are obtained from measurements and are stored within system 10 as reproduction characteristics 28. Additional weighting for translation from the ear to the field and standard acoustic weightings such as A, B and C are optionally included in these characteristics. The short-term level is assessed on a broadband and frequency specific basis. The process of obtaining the short-term level includes squaring the signal and passing it through a filter with a low pass characteristic. The short-term level may then be compared to the exposure limits 30. If it exceeds these then the control process is such that it reduces the input signal by an amount at least equal to the amount by which the short-term level exceeds the exposure limits in dB or by the ratio of the short-term level to the exposure limits in linear terms to produce the output signal 14. Optionally, other processes may be applied to the input signal 12 within the analysis and exposure control process 22 such as fixed or adaptive filtering or gain control.

The protected exposure analysis 24 operates to analyse a signal to produce characteristics of the acoustic exposure of a listener in the form of exposure data 32. The signal to be analysed by the analyser 24 comes from the output signal, 14. The protected exposure analysis 24 receives the reproduction characteristics 28 to produce exposure data that is appropriate for the specific audio reproduction system 20 and earphone 18.

The reproduction characteristics 28 include frequency weightings for each specific audio reproduction system including the earphone are obtained from measurements and are stored within system 10 as reproduction characteristics 28. Additional weightings for translation from the ear to the field and standard acoustic weightings such as A, B and C are optionally included in these characteristics.

The protected exposure analysis 24 includes short-term level assessment on a broadband and frequency specific basis. The process of obtaining the short-term level includes squaring the signal and passing it through a filter with a low pass characteristic, such as a 1st order filter with a 125 millisecond time constant, RMS 'Fast' or 'F' as defined in the standard IEC 60651. The maximum of the short-term level is taken over a given analysis period. The protected exposure analysis 24 also records the time at which the maximum short-term level occurred within a given analysis period and includes this time within the exposure data 32 it produces.

In addition to the above the protected exposure analysis 24 analyses the characteristics of the signal at the time at which the maximum short-term level occurred and produces measures of the abruptness of the signal, the persistence of the signal and the character identification of the signal within a given analysis period and includes this within the exposure data 32 it produces.

The exposure data 32 produced by the protected exposure analysis 24 at the end of each given analysis period such as every half hour includes:

maximum short-term level (broadband & frequency specific)

time of the maximum short-term level (broadband & frequency specific)

abruptness of the signal that produced the maximum short-term level (broadband & frequency specific)

persistence of the signal that produced the maximum short-term level (broadband & frequency specific)

character identification code of the signal that produced the maximum short-term level (broadband & frequency specific)

also included in this data is the maximum peak level the time of the maximum peak level the character identification code of the signal that produced the maximum peak level broadband long-term exposure over the analysis period analysis time Storage 26 receives the exposure data 32 at the end of every analysis period which it stores in memory until the exposure data 32 is required. The storage process involves compressing the exposure data which includes conversion of linear power levels to decibels. The recorded data is available at the recorded data 16 output and is available for display 34 or storage in a database.

An example of the format of the recorded data is as follows:

| Data | DSP Storage | PC: *.csv file |
|---|---|---|
| Date: | 3 bytes | YYYY/MM/DD e.g. 005/03/03, |
| Day: | | 'Monday' to 'Sunday', |
| Time: | | HH:MM eg 13:30, |
| Protected Exposure in dBA SPL Field (0.1 dB resolution): | 2 bytes | NN.N e.g. 76.2 |
| Protected Maximums in dBA SPL @ DRP (0.5 dB resolution): | 1 byte * 33 | NN.N e.g. 94.5 |
| Protected Maximum time offset (1 minute resolution): | 1 byte * 33 | NN e.g. 22 |
| Unprotected Exposure in dBA SPL Field (0.1 dB resolution): | 2 bytes | NN.N e.g. 81.2 |
| Unprotected Maximums in dBA SPL @ DRP (0.5 dB resolution): | 1 byte * 33 | NN.N e.g. 94.5 |
| Unprotected Maximum time offset (1 minute resolution): | 1 byte * 33 | NN e.g. 22 |
| Unprotected Signal ID: | 1 byte * 33 | NN e.g. 15 |
| Listen Time (1 minute resolution): | 1 byte | NN e.g. 16 |
| Talk Time (1 minute resolution): | 1 byte | NN e.g. 8 |
| TOTAL | 174 bytes | |

An example of the data range and resolution in the above format is as follows:

| Data | Step | Range |
|---|---|---|
| Date Day Time | ½ hour | 32 years |
| Protected Exposure in dBA SPL Field (0.1 dB resolution): | 0.1 dB | 0.0 to 127.9 |
| Protected Maximums in dBA SPL @ DRP (0.5 dB resolution): | 0.5 dB | 0.0 to 127.5 |
| Protecetd Maximum time offset (1 minute resolution): | 1 minute | 0 to 29 |
| Unprotected Exposure in dBA SPL Field (0.1 dB resolution): | 0.1 dB | 0.0 to 127.9 |
| Unprotected Maximums in dBA SPL @ DRP (0.5 dB resolution): | 0.5 dB | 0.0 to 127.5 |
| Unprotected Maximum time offset (1 minute resolution): | 1 minute | 0 to 29 |
| Unprotected Signal ID: | 1 | 0 to 255 |
| Listen Time (1 minute resolution): | 1 minute | 0 to 29 |
| Talk Time (1 minute resolution): | 1 minute | 0 to 29 |

Figure 2:
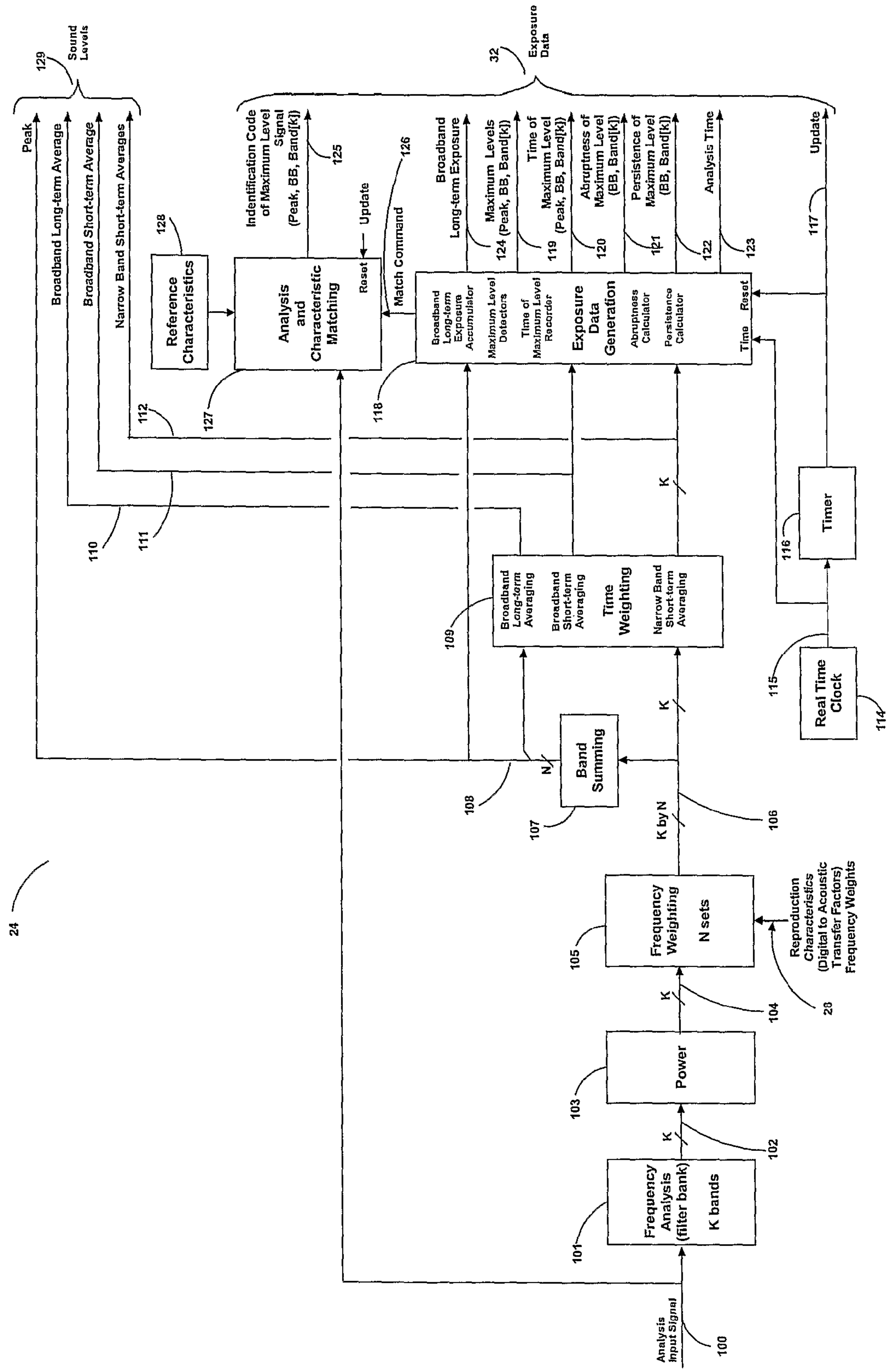
FIG. 2 is a detailed schematic view of the protected exposure analysis of FIG. 1.

Referring now to FIG. 2 a more detailed schematic of the protected exposure analysis 24 of FIG. 1 is shown. The analyser input signal 100 (labelled 14 in FIG. 1) is applied to a frequency analysis filter bank 101. The filter bank 101 splits the signal into a number (K) of frequency bands. In this embodiment the centre frequencies are linearly spaced and the bandwidths of the filters are constant. In another embodiment, the centre frequencies are logarithmically spaced and the bandwidths of the filters are third octave. In another embodiment, the filter centre frequencies and bandwidths are modelled on the human ear. Those skilled in the art will be aware of many techniques to achieve separation of the signal into a number of frequency bands including IIR filter banks, FIR filter banks, wavelets and discrete Fourier analysis.

The band signals 102 are squared by 103 to produce power signals 104 for each of the bands. The power signals 104 are weighted (multiplied) by frequency weights 105 to produce the frequency weighted power signals 106. The frequency weights represent the relationship between the digital signal level and the acoustic signal level produced by the earphone. These are the reproduction characteristics 28 and include any additional weights. The acoustic signal level is measured in a specific coupler or ear simulator such as those described in ITU-T Recommendation P57. Additional weights include A, B and C sound level weights and weights to translate the earphone measures at the ear (such as those taken at the eardrum reference point, DRP) to the field. Particular frequency weights are often associated with particular time weights in acoustic measurement. Many standards specify A weighting for long-term exposure in the field and C weighting for peak measures in the field. This embodiment applies the following three (N) additional weightings to the weights obtained for the digital to acoustic transfer function of the specific audio reproduction system including the earphone to produce a set of three frequency weighting functions:

1. A-weighting plus translation to the field for the broadband long-term average sound level,
2. C-weighting plus translation to the field for peak sound level,
3. A-weighting for broadband short-term average sound level and the narrow band (frequency specific) short-term average sound level.

The frequency weighted power signals 106 are summed by 107 to produce the broadband frequency weighted power signals 108. In an alternative embodiment of this method the broadband frequency weighted power signals 108 are obtained by squaring the output of filters applied to the input signal 100, these filters having the same magnitude response as the above frequency weighted digital to acoustic transfer functions.

The broadband frequency weighted power signals 108 are applied to time weighting operations 109 to produce the broadband long-term average 110 and the broadband short-term average 111 sound level estimations.

The broadband long-term average 110 is obtained by low pass filtering the appropriate frequency weighted broadband power signal 108. In this embodiment the low pass filter is a 1st order infinite impulse response filter with an exponential integration time constant in the order of many minutes. The broadband short-term average 111 is obtained by low pass filtering the appropriate frequency weighted broadband power signal 108. In this embodiment the low pass filter is a 1st order infinite impulse response filter with an exponential integration time constant of 125 milliseconds corresponding to the 'Fast' or 'F' integration time constant specified for sound level meters in the standard IEC 60651. Other filters and time constants may be employed.

The narrow band short-term averages 112 are obtained by applying low pass filtering to each of the appropriate frequency weighted power signals 106. The filtering is the same as that described for the broadband short-term average.

The real time clock 114 produces a time code 115. The time code is applied to timer 116 which produces an update command 117 at predefined time intervals, these being the analysis periods. In this embodiment the analysis period is 30 minutes however the period depends on the application. A trade off exists between the time resolution of the data and the amount of storage required to accommodate it.

The generation of detailed exposure data is performed by 118. The maximum levels 119, the times of maximum levels 120, the abruptness of maximum levels 121 the persistence of maximum levels 122, the analysis time 123, the broadband long-term exposure 124 and the identification code of the maximum level signals 125 are produced at the end of each predefined analysis period.

The maximum level (Peak) 119 is the maximum peak level of the appropriate frequency weighted broadband power signal 108 over the analysis period. The maximum level (BB) 119 is the maximum value of the broadband short-term average sound level 111 over the analysis period. The maximum levels (Band[k]) 119 are the maximum values of the narrow-band short-term sound levels 112 over the analysis period.

The time of maximum level (Peak) 120 is the sampled real-time clock value at the time at which the maximum of the appropriate frequency weighted broadband power signal 108 occurred during the analysis period. The time of the maximum level (BB) 120 is the sampled real-time clock value at the time at which the maximum of the broadband short-term average sound level 111 occurred. The times of the maximum level (Band[k]) 120 are the sampled real-time clock values at the times at which the maximum of the narrow-band short-term average sound levels 112 occurred.

The abruptness of the maximum levels 121 for the broadband and narrow-band short-term average sound levels are obtained as follows. The short-term average sound levels are sampled at periodic intervals and placed into circular buffers. In this embodiment this occur every 8 milliseconds. When a maximum of a short-term average sound level occurs its respective buffer contents is analysed in reverse order starting at the time of the maximum. The number of samples from the time of the maximum is counted until the short-term average sound level falls below the maximum level by a predefined factor. In this embodiment the factor is set to be 0.1. The number of samples counted multiplied by the sampling time interval is the abruptness rating in seconds.

The persistence of the maximum levels 122 for the broadband and narrow-band short-term average sound levels are obtained as follows. When a maximum short-term average sound level occurs the real-time clock value is sampled and saved as the start time. The short-term sound level is monitored and the real-time clock value is sampled again when the short-term sound level falls below the maximum by a predefined factor, this is the stop time. In this embodiment this factor is set to 0.1. The persistence is the difference in time between the start and the stop times.

The broadband long-term exposure 124 is obtained by accumulating the appropriate frequency weighted broadband power signal 108 over the analysis period and scaling it by the inverse of the product of the analysis period and the sampling rate.

Identification codes of the signals producing the maximum levels 125 for the peak, broadband and narrow-band short-term sound levels are obtained as follows. When a maximum sound level occurs a match request command 126 is issued to identification means in the form of analysis and characteristic matching process 127. The analysis and characteristic matching process contains a circular buffer which receives samples of the input signal 100. When a match request is received a predefined number of samples representing the signal over a predefined period prior to the match request being received are copied from the circular buffer into an analysis buffer. The analysis buffer then fills with a predefined number of samples received from the input following the match request. The contents of the analysis buffer is analysed and its characteristics are extracted. Those skilled in the art will be aware of many techniques available to analyse a signal and determine its character. This embodiment uses frequency analysis to obtain detailed spectral characteristics. The characteristics are compared with predefined reference characteristics 128 and the best match is determined. An identification code for the maximum level signal 125 corresponding to the reference characteristic which yields the best match is generated. In telecommunications there are many non speech signals that have known characteristics, such as service tones, DTMF tones, fax machine tones and so forth which may be identified and for which an identification code can be produced.

At the end of an analysis period as defined by timer 116 the time from the real time clock 114 output is sampled by exposure data generation 118 to produce the analysis time 123. The update command 117 issued at the end of analysis period provides a request to the storage 26 to store the current exposure data. The update command 117 then resets all the exposure data values within the exposure data generation 118 and the analysis and characteristic matching 127 to zero.

Figure 3:
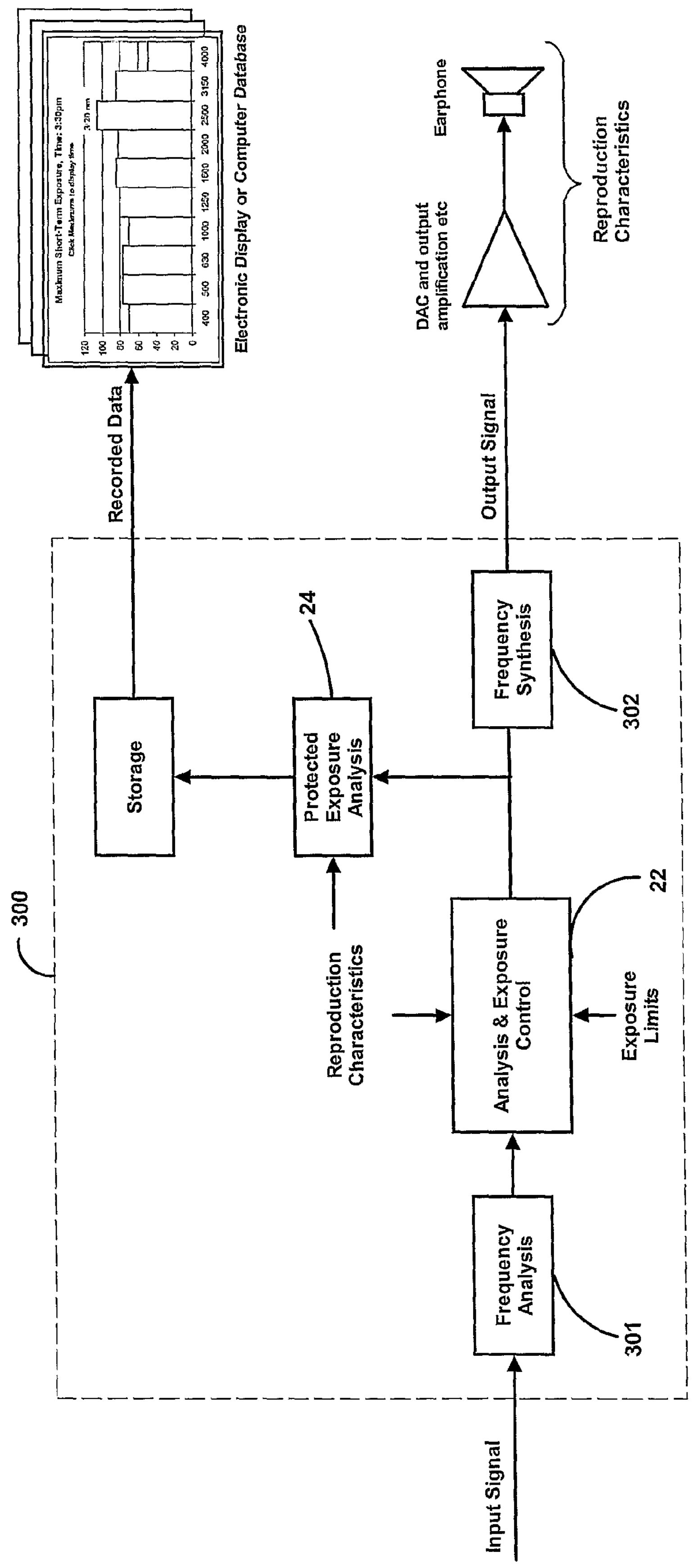
FIG. 3 is a schematic view of a second embodiment of a system according to the present invention.

Referring to FIG. 3, a second embodiment is shown including a system 300 for controlling and recording earphone sound levels. The system is in most respects identical to the first embodiment as shown in FIG. 1 and as previously described. It differs from the first embodiment in that all the processing is performed jointly in the frequency domain yielding added processing efficiencies. Two new processes are added, a frequency analysis 301 and a frequency synthesis 302.

The frequency analysis 301 splits the signal into a number (K) of frequency bands. In this embodiment the centre frequencies of the filters are linearly spaced and the bandwidths of the filters are constant. In another embodiment, the centre frequencies are logarithmically spaced and the bandwidths of the filters are third octave. In another embodiment, the filter centre frequencies and bandwidths are modelled on the human ear. Those skilled in the art will be aware of many techniques to achieve separation of the signal into a number of frequency bands including IIR filter banks, FIR filter banks, wavelets and discrete Fourier analysis.

The frequency synthesis 302 reconstructs the output signal from the (K) frequency bands of the output of the analysis and exposure control process 22. The method of reconstruction matches the method of frequency analysis performed by the frequency analysis 301.

Due to signals in this embodiment being in the frequency domain (other than the input signal and the output signal) frequency analysis is no longer required within the analysis and exposure control 22 and the protected exposure analysis 24. Referring again to detailed schematic of the protected exposure analysis 24 in FIG. 2 the following processes may be bypassed. These are the frequency analysis (filter bank)

101 and the frequency analysis performed within the process analysis and characteristic matching 127.

Figure 4:
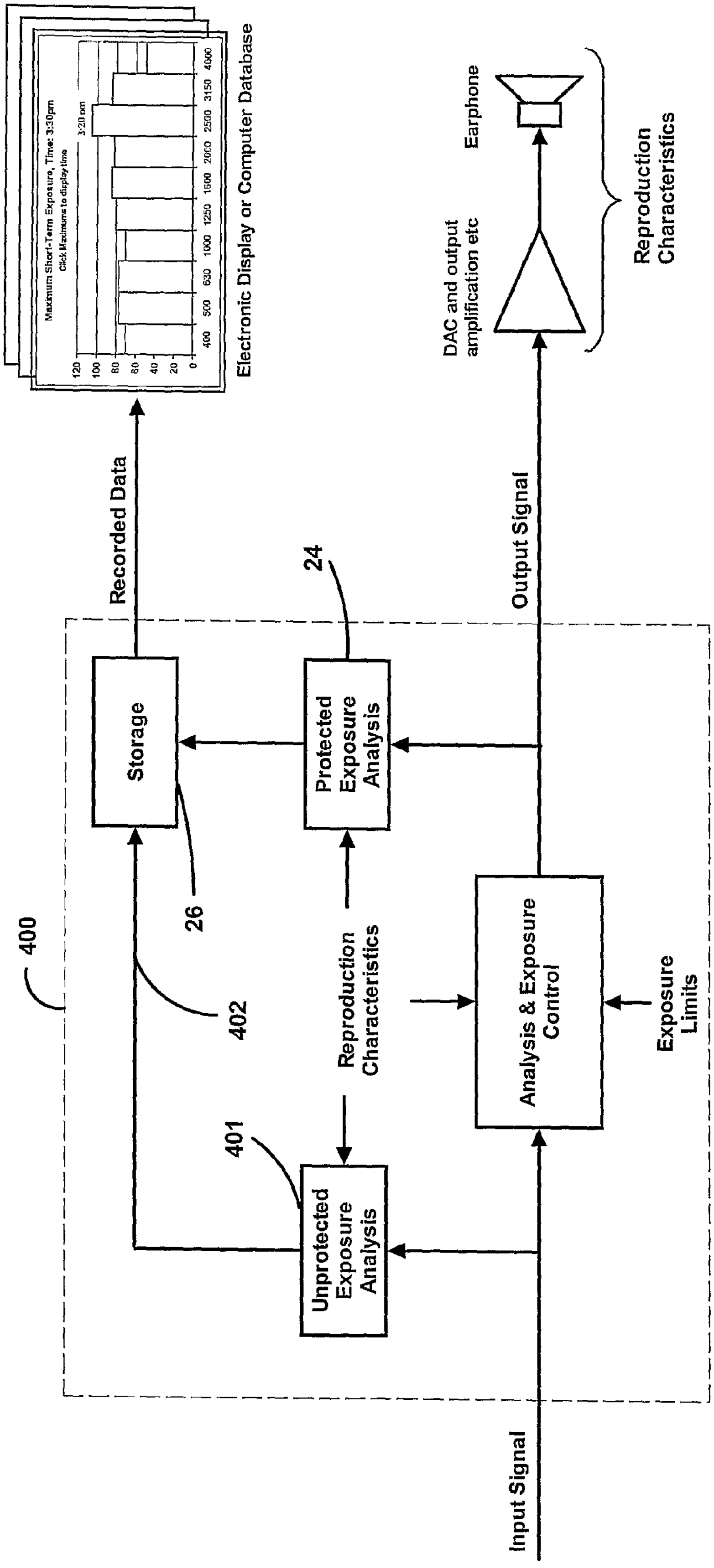
FIG. 4 is a schematic view of a third embodiment of a system according to the present invention.

Referring to FIG. 4, a third embodiment is shown including system 400 for controlling and recording earphone sound levels. The system is in most respects identical to the first embodiment as shown in FIG. 1 and as previously described. It differs from the first embodiment in that it produces unprotected exposure data as well as protected exposure data. This is of interest when one wants to know what the exposure would have been if exposure control was not applied. It is of particular relevance in identifying offensive signals on the input than may not be present on the output due to the exposure control provided by the system. One new process is added, this is the unprotected exposure analysis 401 which produces unprotected exposure data 402. The unprotected exposure analysis 401 is identical to the protected exposure analysis 24. The unprotected exposure data it produces is labelled as unprotected exposure data and stored by storage 26.

Figure 5:
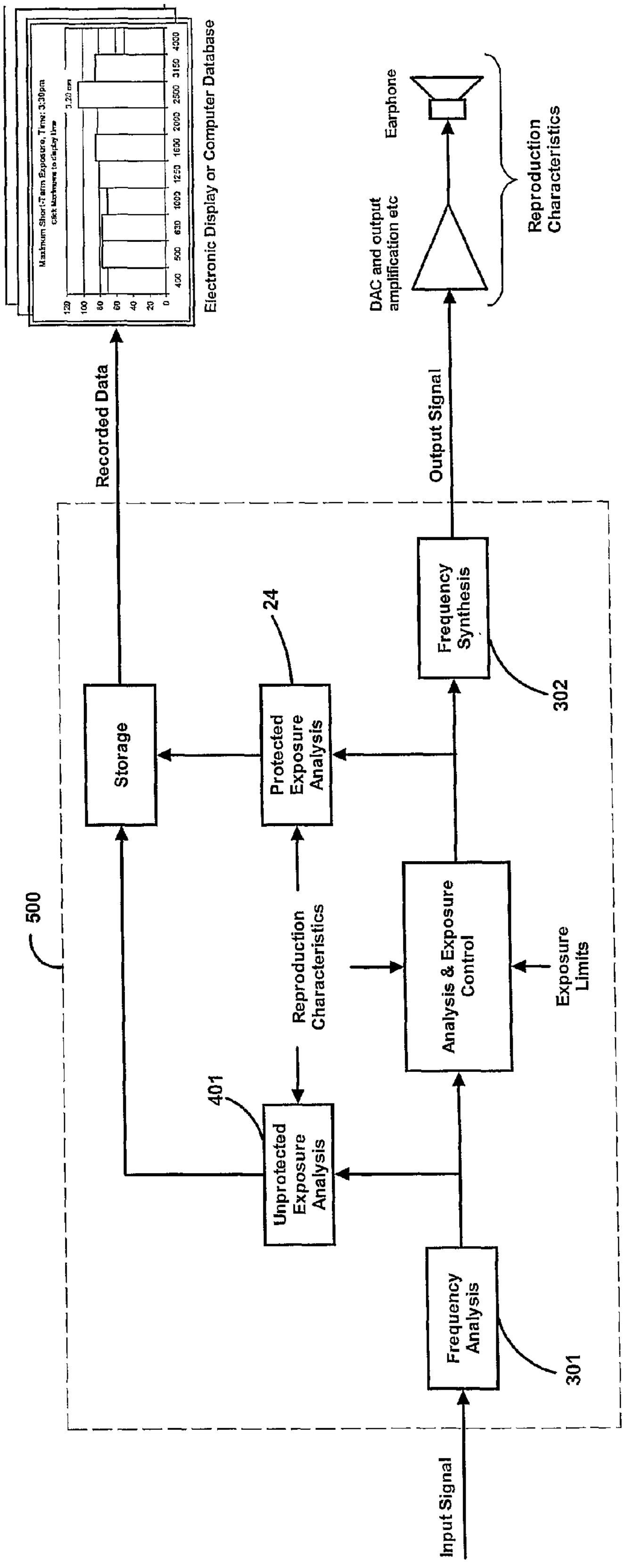
FIG. 5 is a schematic view of a fourth embodiment of a system according to the present invention.

Referring to FIG. 5, a fourth embodiment is shown including system 500 for controlling and recording earphone sound levels. The system is in most respects identical to the third embodiment as shown in FIG. 4 and as previously described. It differs from the third embodiment in that all the processing is performed jointly in the frequency domain yielding added processing efficiencies. Two new processes are added, a frequency analysis 301 and a frequency synthesis 302. The operation and effect of these processes is as previously described in the description relating to FIG. 3. The changes to the unprotected exposure analysis 401 are the same as the changes previously described for the protected exposure analysis 24.

Figure 6:
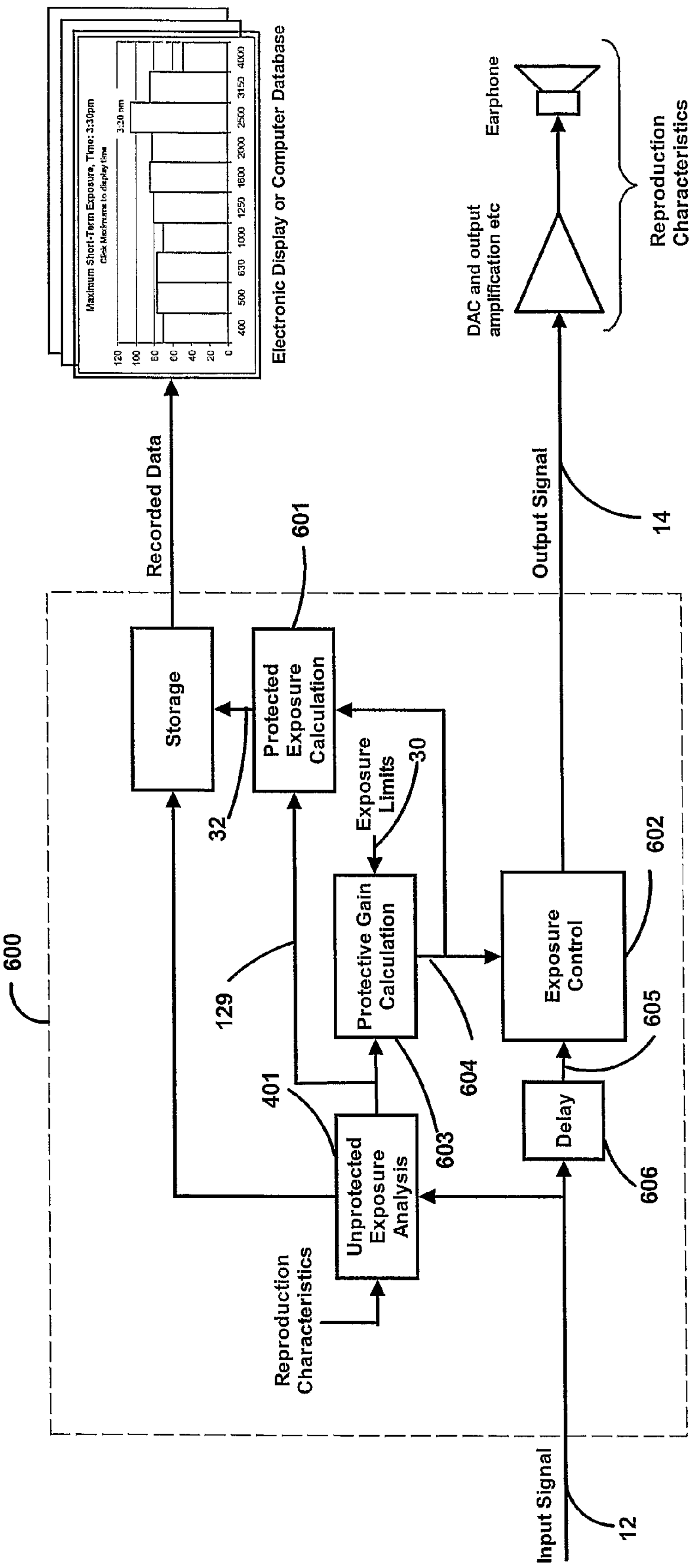
FIG. 6 is a schematic view of a fifth embodiment of a system according to the present invention.

Referring to FIG. 6, a fifth embodiment is shown including system 600 for controlling and recording earphone sound levels. The system is in many respects the same as the third embodiment as shown in FIG. 4 and as previously described. The major departures are as follows. Firstly, no direct protected exposure analysis of the output signal 14 is performed. The protected exposure data 32 is instead produced by the protected exposure calculation 601. Secondly, the control of exposure, exposure control 602 is based on the analysis provided by the unprotected exposure analysis 401. The details of unprotected exposure analysis process are the same as those previously described for the protected exposure analysis which are detailed in FIG. 2 and its description. Referring now to FIG. 2 a set of sound levels 129 is produced. These are the peak 108, the broadband long-term average 110, the broadband short-term average 111, and the narrow band short-term averages 112.

Referring again to FIG. 6 the set of sound levels 129 are inputs to the protective gain calculator 603. The protective gain calculator also accepts exposure limits 30. There are exposure limits for each of the estimates of the sound level 129: the peak, the broadband long-term average, the broadband short-term average, and the narrow band short-term averages. The protective gain calculator compares the estimates of sound level 129 with the exposure limits 30. If a sound level estimate exceeds its corresponding exposure limit then a corresponding protective gain 604 equal to the exposure limit divided by its corresponding sound level estimate is produced, otherwise the corresponding protective gain is set to unity. The signals are therefore attenuated so that acoustic exposure limits that are set are not exceeded.

The protective gains 604 are provided as control inputs to the exposure control 602. In this embodiment the exposure control 602 combines the peak, the broadband long-term average, and the broadband short-term average protective gains into a single broadband gain by taking the minimum of them. This single broadband gain is then combined with each of the narrow band short-term gains by taking the minimum of each narrow band short-term gain and the single broadband gain to produce a set of K multi band protective gains. In this embodiment the exposure control is multi band, the input signal is split into K frequency bands (frequency analysis) and modified (multiplied) by the K multi band protective gains and recombined (frequency synthesis) to produce the exposure controlled output signal 14. In another embodiment the minimum of all the gains, broad and narrow band is taken to produce a single broadband gain for a single band exposure control operation. The input signal 605 to exposure control 602 is a delayed version of the input signal 12 to the system, the delay is provided by 606. This delay is needed to compensate for the time delay introduced by the unprotected exposure analysis 401.

The protective exposure calculator 601 is similar to the protective exposure analysis 24 previously described. It differs in the following ways. It creates a set of protected sound levels by multiplying the sound levels 129 from the unprotected exposure analysis 401 by the corresponding set of protective gains 604. Referring now to FIG. 2, these protected sound levels are applied directly to the exposure data generation 118 from which is produced the set of exposure data 32. The analysis and characteristic matching 127 is not performed. Only the real time clock 114, the timer 116 and the exposure data generation 118 are required.

Figure 7:
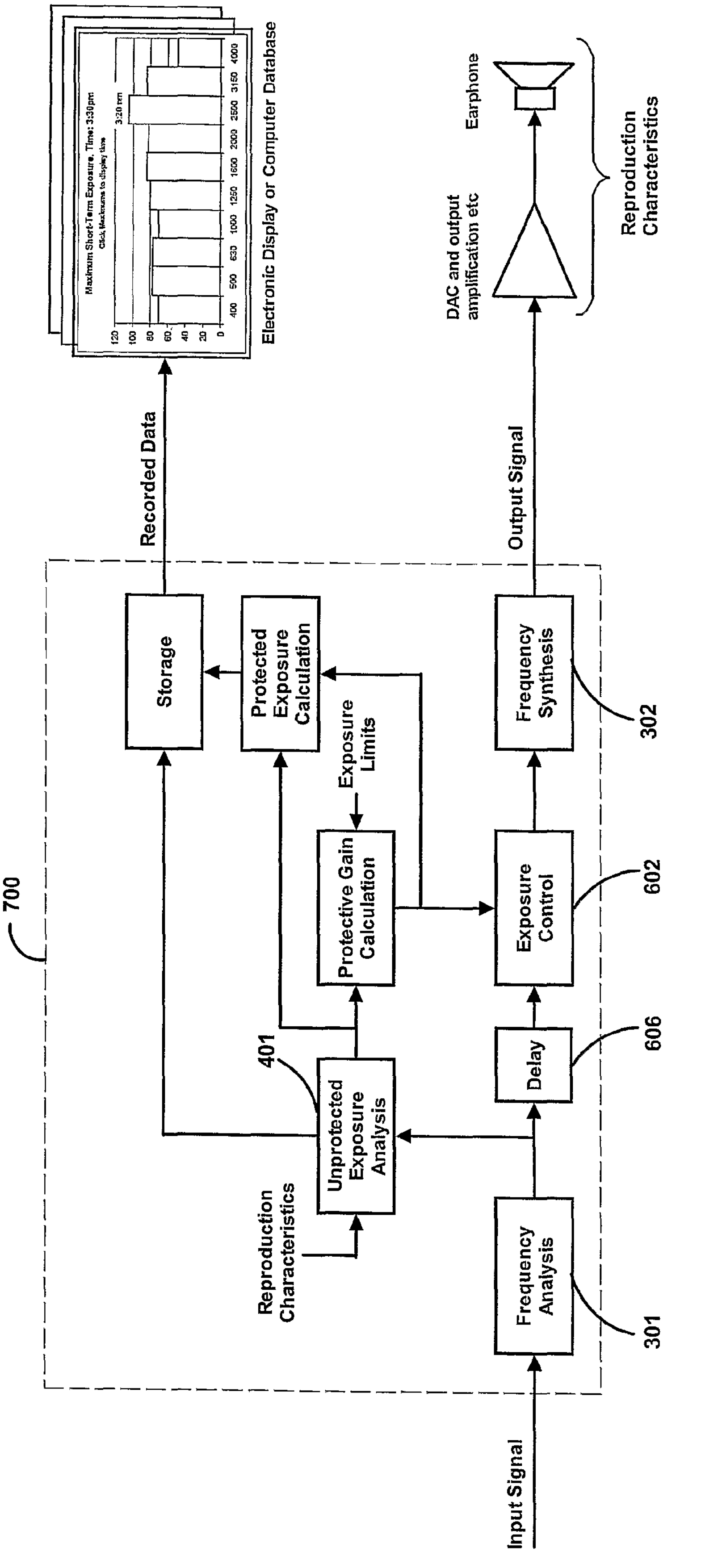
FIG. 7 is a schematic view of a sixth embodiment of a system according to the present invention.

Referring to FIG. 7, a sixth embodiment is shown including system 700 for controlling and recording earphone sound levels. The system is in most respects identical to the fifth embodiment as shown in FIG. 6 and as previously described. It differs from the fifth embodiment in that all the processing is performed jointly in the frequency domain yielding added processing efficiencies. Two new processes are added, a frequency analysis 301 and a frequency synthesis 302. The operation and effect of these processes is as previously described in the description relating to FIG. 3. The changes to the unprotected exposure analysis 401 are the same as the changes previously described for the protected exposure analysis 24. Other changes are that the delay 606 is a set of K delays, one for each frequency band. A further change is that the exposure control 602 does not contain frequency analysis or synthesis operations.

Figure 8:
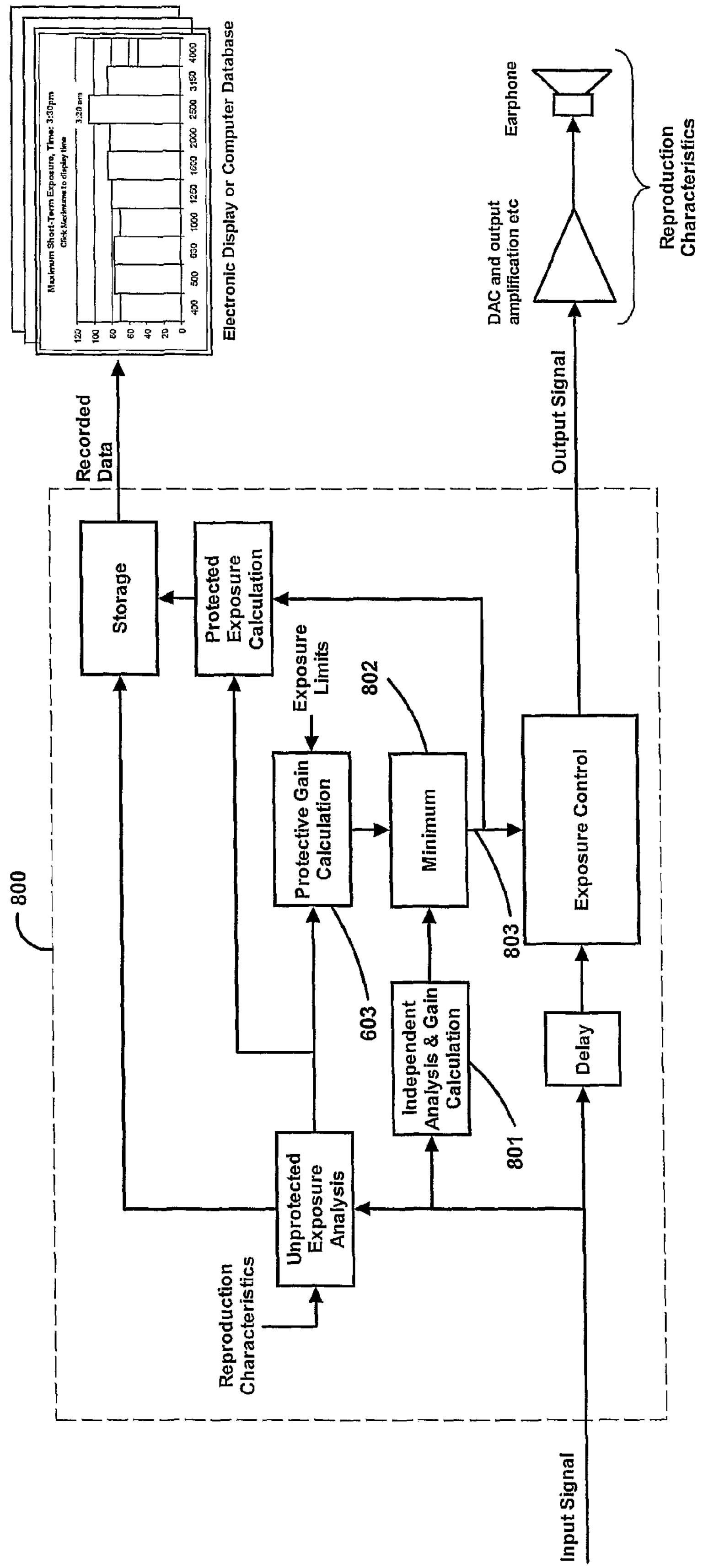
FIG. 8 is a schematic view of a seventh embodiment of a system according to the present invention.

Referring to FIG. 8, a seventh embodiment is shown including system 800 for controlling and recording earphone sound levels. The system is in most respects the same as the fifth embodiment as shown in FIG. 6 and as previously described. The main change is the inclusion of an independent analysis and gain calculation 801 and the minimum function 802. There are acoustic exposure protection techniques that do not rely on the absolute values of signals but on their relative values such as shriek rejection, this arrangement accommodates these additions. The minimum function 802 produces a set of protective gains 803 that are the minimum of the protective gains produced by the protective gain calculation 603 and the independent analysis and gain calculation 801.

Figure 9:
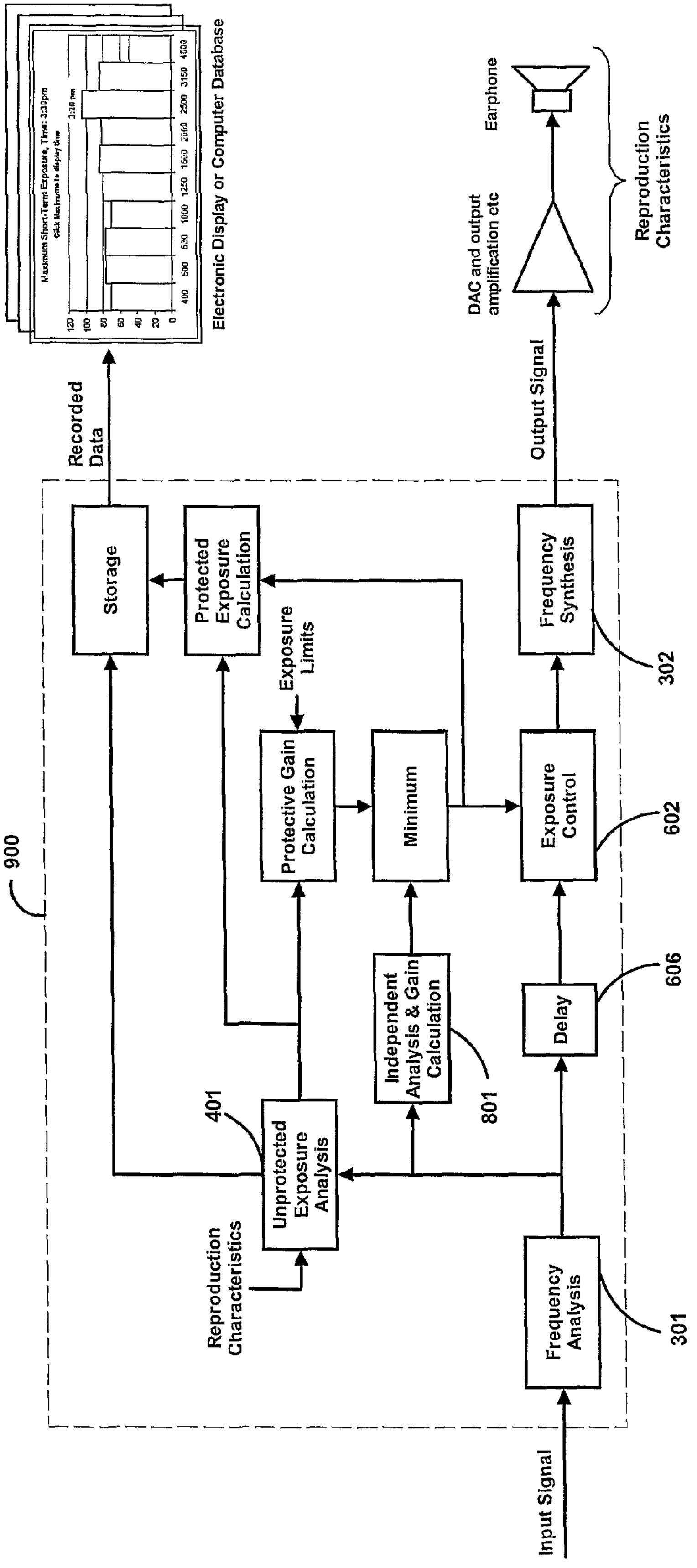
FIG. 9 is a schematic view of an eighth embodiment of a system according to the present invention.

Referring to FIG. 9, an eighth embodiment is shown including system 900 for controlling and recording earphone sound levels. The system is in most respects identical to the seventh embodiment as shown in FIG. 8 and as previously described. It differs from the seventh embodiment in that all the processing is performed jointly in the frequency domain yielding added processing efficiencies. Two new processes are added, a frequency analysis 301 and a frequency synthesis 302. The operation and effect of these processes is as previously described in the description relating to FIG. 3. The changes to the unprotected exposure analysis 401 are the same as the changes previously described for the protected exposure analysis 24. Other changes are that the delay 606 in a set of K delays, one for each frequency band and the independent analysis and gain calculation 801 is provided with a frequency analysed signal rather than performing this operation. A further change is that the exposure control 602 does not contain frequency analysis or synthesis operations.

In the foregoing description an earphone is intended to refer to any electro-acoustic transducer for converting electric signals into sounds which can be held over or inserted into the ear. An audio system is intended to refer to any sound reproduction system that reproduces sounds by way of an earphone such as telephone headsets or handsets, personal music players, mobile telephones, two way radios and the like.

The above described embodiments are meant to be illustrative and not limiting. It will be obvious to those skilled in the art that variations and modifications may be made without departing from the spirit and scope of the invention as defined by the appended claims.

The invention claimed is:

1. A method of reproducing an audio signal by way of an audio system which includes an earphone, the method including the steps of:

providing at least one reproduction characteristic of an audio system based on at least one measured sound reproduction characteristic of the audio system;

receiving an audio signal;

estimating at least one short-term characteristic of sound exposure of a listener to the audio system reproducing the received audio signal, the at least one short-term characteristic of sound exposure of a listener to the audio system reproducing the received audio signal including at least one estimate of short-term level of sound exposure of a listener to the audio system reproducing the received audio signal;

providing at least one sound exposure limit, the at least one sound exposure limit including at least one sound exposure limit relevant to the at least one estimate of short-term level of sound exposure of a listener to the audio system reproducing the received audio signal;

controlling the received audio signal to produce a controlled audio signal including the conditional control that if the at least one estimate of short-term level of sound exposure of a listener to the audio system reproducing the received audio signal exceeds the relevant at least one sound exposure limit, then controlling the received audio signal to produce a controlled audio signal in which this excess is reduced;

estimating at least one short-term characteristic of sound exposure of a listener to the audio system reproducing the controlled audio signal, the at least one short-term characteristic of sound exposure of a listener to the audio system reproducing the controlled audio signal including at least one estimate of short-term level of sound exposure of a listener to the audio system reproducing the controlled audio signal based on the at least one reproduction characteristic;

storing the at least one short-term characteristic of sound exposure of a listener to the audio system reproducing the controlled audio signal in memory for subsequent output, the at least one short-term characteristic of sound exposure of a listener to the audio system reproducing the controlled audio signal including the at least one estimate of short-term level of sound exposure of a listener to the audio system reproducing the controlled audio signal based on the at least one reproduction characteristic; and outputting the controlled audio signal for reproduction.

2. A method according to claim 1 comprising the further step of storing the at least one short-term characteristic of sound exposure of a listener to the audio system reproducing the received audio signal in memory for subsequent output, the at least one short-term characteristic of sound exposure of a listener to the audio system reproducing the received audio signal including the at least one estimate of short-term level of sound exposure of a listener to the audio system reproducing the received audio signal based on the at least one reproduction characteristic.

3. A method according to claim 1 comprising the further step of outputting the stored at least one short-term characteristic of sound exposure of a listener to the audio system reproducing the controlled audio signal, the at least one short-term characteristic of sound exposure of a listener to the audio system reproducing the controlled audio signal including the at least one estimate of short-term level of sound exposure of a listener to the audio system reproducing the controlled audio signal based on the at least one reproduction characteristic for display, storage or further processing.

4. A method according to claim 1 wherein the at least one short-term characteristic of sound exposure of a listener to the audio system reproducing the controlled audio signal includes estimates of short-term level of frequency specific sound exposure of a listener to the audio system reproducing the controlled audio signal based on the at least one reproduction characteristic in a plurality of frequency bands.

5. A method according claim 1 wherein the at least one short-term characteristic of sound exposure of a listener to the audio system reproducing the controlled audio signal includes an estimate of the maximum of short-term level of sound exposure of a listener to the audio system reproducing the controlled audio signal based on the at least one reproduction characteristic.

6. A method according to claim 1 wherein the at least one short-term characteristic of the sound exposure of a listener to the audio system reproducing the controlled audio signal includes estimates of the maximum of short-term level of frequency specific sound exposure of a listener to the audio system reproducing the controlled audio signal based on the at least one reproduction characteristic in a plurality of frequency bands.

7. A method according to claim 1 wherein the at least one short-term characteristic of the sound exposure of a listener to the audio system reproducing the controlled audio signal includes an estimate of the time at which short-term level of sound exposure of a listener to the audio system reproducing the controlled audio signal based on the at least one reproduction characteristic reached a maximum value.

8. A method according to claim 1 wherein the at least one short-term characteristic of sound exposure of a listener to the audio system reproducing the controlled audio signal includes estimates of the time at which short-term level of frequency specific sound exposure of a listener to the audio system reproducing the controlled audio signal based on the at least one reproduction characteristic reach maximum values in a plurality of frequency bands.

9. A method according to claim 1 wherein the at least one short-term characteristic of sound exposure of a listener to the audio system reproducing the controlled audio signal includes at least one estimate of the duration over which the at least one estimate of short-term level of sound exposure of a listener to the audio system reproducing the controlled audio signal exceeds a predetermined fraction of the estimate of the maximum of short-term level of sound exposure of a listener to the audio system reproducing the controlled audio signal.

10. A method according to claim 1 wherein the at least one short-term characteristic of the sound exposure of a listener to the audio system reproducing the controlled audio signal includes at least one estimate of the abruptness of the maximum of short-term level of sound exposure of a listener to the audio system reproducing the controlled audio signal.

11. A method according to claim 1 wherein the at least one short-term characteristic of the sound exposure of a listener to the audio system reproducing the controlled audio signal includes an identification code for the signal that produced the maximum of short-term level of sound exposure of a listener to the audio system reproducing the controlled audio signal.

12. A computer-readable medium that is programmed with a computer software program that provides instructions for controlling a computing system to carry out the method of claim 1.

13. A system for reproducing an audio signal by way of an audio system which includes an earphone, the system including:

- storage means for storing and providing at least one reproduction characteristic of an audio system based on at least one measured sound reproduction characteristic of the audio system;
- receiving means for receiving an audio signal;
- estimating means for estimating at least one short-term characteristic of sound exposure of a listener to the audio system reproducing the received audio signal, the at least one short-term characteristic of sound exposure of a listener to the audio system reproducing the received audio signal including at least one estimate of short-term level of sound exposure of a listener to the audio system reproducing the received audio signal;
- storage means for storing at least one sound exposure limit, the at least one sound exposure limit including at least one sound exposure limit relevant to the at least one estimate of short-term level of sound exposure of a listener to the audio system reproducing the received audio signal;
- control means for controlling the received audio signal to produce a controlled audio signal including the conditional control that if the at least one estimate of short-term level of sound exposure of a listener to the audio system reproducing the received audio signal exceeds the relevant at least one sound exposure limit then controlling the received audio signal to produce a controlled audio signal in which this excess is reduced;
- estimating means for estimating at least one short-term characteristic of sound exposure of a listener to the audio system reproducing the controlled audio signal, the at least one short- term characteristic of sound exposure of a listener to the audio system reproducing the controlled audio signal including at least one estimate of short-term level of sound exposure of a listener to the audio system reproducing the controlled audio signal based on the at least one reproduction characteristic;
- storage means for storing the at least one short-term characteristic of sound exposure of a listener to the audio system reproducing the controlled audio signal in memory for subsequent output, the at least one short-term characteristic of sound exposure of a listener to the audio system reproducing the controlled audio signal including the at least one estimate of short-term level of sound exposure of a listener to the audio system reproducing the controlled audio signal based on the at least one reproduction characteristic; and
- outputting means for outputting the controlled audio signal for reproduction.

14. A system according to claim 13 wherein the storage means is arranged to store the at least one short-term characteristic of sound exposure of a listener to the audio system reproducing the received audio signal in memory for subsequent output, the at least one short-term characteristic of sound exposure of a listener to the audio system reproducing the received audio signal including the at least one estimate of short-term level of sound exposure of a listener to the audio system reproducing the received audio signal based on the at least one reproduction characteristic.

15. A system according to claim 13 wherein the outputting means is further arranged to output the stored at least one short-term characteristic of sound exposure of a listener to the audio system reproducing the controlled audio signal, the at least one short-term characteristic of sound exposure of a listener to the audio system reproducing the controlled audio signal including the at least one estimate of short-term level of sound exposure of a listener to the audio system reproducing the controlled audio signal based on the at least one reproduction characteristic for display, storage or further processing.

16. A system according to claim 13 wherein the at least one short-term characteristic of sound exposure of a listener to the audio system reproducing the controlled audio signal includes estimates of short-term level of frequency specific sound exposure of a listener to the audio system reproducing the controlled audio signal based on the at least one reproduction characteristic in a plurality of frequency bands.

17. A system according to claim 13 wherein the at least one short-term characteristic of sound exposure of a listener to the audio system reproducing the controlled audio signal includes an estimate of the maximum of short-term level of sound exposure of a listener to the audio system reproducing the controlled audio signal based on the at least one reproduction characteristic.

18. A system according to claim 13 wherein the at least one short-term characteristic of the sound exposure of a listener to the audio system reproducing the controlled audio signal includes estimates of the maximum of short-term level of frequency specific sound exposure of a listener to the audio system reproducing the controlled audio signal based on the at least one reproduction characteristic in a plurality of frequency bands.

19. A system according to claim 13 wherein the at least one short-term characteristic of the sound exposure of a listener to the audio system reproducing the controlled audio signal includes an estimate of the time at which short-term level of sound exposure of a listener to the audio system reproducing the controlled audio signal based on the at least one reproduction characteristic reached a maximum value.

20. A system according to claim 13 wherein the at least one short-term characteristic of sound exposure of a listener to the audio system reproducing the controlled audio signal includes estimates of the time at which short-term level of frequency specific sound exposure of a listener to the audio system reproducing the controlled audio signal based on the at least one reproduction characteristic reach maximum values in a plurality of frequency bands.

21. A system according to claim 13 wherein the at least one short-term characteristic of sound exposure of a listener to the audio system reproducing the controlled audio signal includes at least one estimate of the duration over which the at least one estimate of short-term level of sound exposure of a listener to the audio system reproducing the controlled audio signal exceeds a predetermined fraction of the estimate of the maximum of short-term level of sound exposure of a listener to the audio system reproducing the controlled audio signal.

22. A system according to claim 13 wherein the at least one short-term characteristic of the sound exposure of a listener to the audio system reproducing the controlled audio signal includes at least one estimate of the abruptness of the maximum of short-term level of sound exposure of a listener to the audio system reproducing the controlled audio signal.

23. A system according to claim 13 wherein the at least one short-term characteristic of the sound exposure of a listener to the audio system reproducing the controlled audio signal includes an identification code for the signal that produced the maximum of short-term level of sound exposure of a listener to the audio system reproducing the controlled audio signal.

* * * * *

UNITED STATES PATENT AND TRADEMARK OFFICE

CERTIFICATE OF CORRECTION

PATENT NO. : 8,165,319 B2
APPLICATION NO. : 11/915542
DATED : April 24, 2012
INVENTOR(S) : Fisher It is certified that error appears in the above-identified patent and that said Letters Patent is hereby corrected as shown below:

In the Claims

In Column 12, Line 32, in Claim 5, delete “according claim” and insert -- according to claim --, therefor.

Signed and Sealed this
Seventh Day of October, 2014

Michelle K. Lee

Michelle K. Lee
*Deputy Director of the United States Patent and Trademark Office*